(12) United States Patent
Komura et al.

(10) Patent No.: US 11,870,211 B2
(45) Date of Patent: Jan. 9, 2024

(54) ILLUMINATION DEVICE

(71) Applicant: Japan Display Inc., Tokyo (JP)

(72) Inventors: Shinichi Komura, Tokyo (JP); Koichi Okuda, Tokyo (JP); Ken Onoda, Tokyo (JP); Hiroaki Kijima, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/657,379

(22) Filed: Mar. 31, 2022

(65) Prior Publication Data

US 2022/0320818 A1    Oct. 6, 2022

(30) Foreign Application Priority Data

Apr. 5, 2021    (JP) ................... 2021-064251

(51) Int. Cl.
*H01S 5/00*    (2006.01)
*F21V 8/00*    (2006.01)
*H01S 5/40*    (2006.01)

(52) U.S. Cl.
CPC ............ *H01S 5/0071* (2013.01); *G02B 6/002* (2013.01); *G02B 6/0031* (2013.01); *G02B 6/0068* (2013.01); *H01S 5/4093* (2013.01)

(58) Field of Classification Search
CPC ..... H01S 5/0071; H01S 5/4093; G02B 6/002; G02B 6/0031; G02B 6/0068
See application file for complete search history.

(56) References Cited

U.S. PATENT DOCUMENTS

2002/0105997 A1*   8/2002   Zhang .................. H01S 3/0941
                                                                    372/34

FOREIGN PATENT DOCUMENTS

JP    2009-087570 A    4/2009
JP    2012-123995 A    6/2012

* cited by examiner

*Primary Examiner* — Andrew J Coughlin
*Assistant Examiner* — Jessica M Apenteng
(74) *Attorney, Agent, or Firm* — Maier & Maier, PLLC (57) ABSTRACT

According to one embodiment, an illumination device includes a light guide having a first plane, a second plane, a side plane, a first tilted plane, and a second tilted plane, an angle formed between the side plane and the first tilted plane and an angle formed between the side plane and the second tilted plane being acute angles, a first semiconductor laser element including a first light emitting part, and a second semiconductor laser element including a second light emitting part. The first light emitting part is opposed to a first intersection part of the side plane and the first tilted plane, and the second light emitting part is opposed to a second intersection part of the side plane and the second tilted plane.

9 Claims, 10 Drawing Sheets

ILLUMINATION DEVICE

CROSS-REFERENCE TO RELATED APPLICATIONS

This application is based upon and claims the benefit of priority from Japanese Patent Application No. 2021-064251, filed Apr. 5, 2021, the entire contents of which are incorporated herein by reference.

FIELD

Embodiments described herein relate generally to an illumination device.

BACKGROUND

Recently, various illumination devices (backlight devices) for illuminating liquid crystal panels have been proposed. For example, a technology of aligning a longitudinal direction of a laser beam emitted from a semiconductor laser device with a longitudinal direction of a side surface of a light guide has been known. In addition, as the other example, a technology in which a light guide includes a light collecting unit tilted toward an LED light source at an end part opposed to the LED light source, has been known.

In an illumination device, light beams of respective colors are required to be sufficiently mixed when light of wavelengths different from each other is made incident on the light guide. In particular, when a semiconductor laser device is used as the light source, the length of the light guide required for the light beams of the respective colors to sufficiently mix tends to increase since the light emitted from the semiconductor laser device has a high directivity.

DETAILED DESCRIPTION

In general, according to one embodiment, an illumination device includes: a light guide having a first plane, a second plane opposed to the first plane and substantially parallel to the first plane, a side plane, a first tilted plane located between the side plane and the first plane and tilted to the first plane, and a second tilted plane located between the side plane and the second plane and tilted to the second plane, an angle formed between the side plane and the first tilted plane and an angle formed between the side plane and the second tilted plane being acute angles; a first semiconductor laser element including a first base and a first light emitting part; and a second semiconductor laser element including a second base and a second light emitting part, wherein the first base and the second base are non-parallel to each other, the first light emitting part is opposed to a first intersection part of the side plane and the first tilted plane, and the second light emitting part is opposed to a second intersection part of the side plane and the second tilted plane.

According to the other embodiment, an illumination device includes: a light guide having a first plane, a first tilted plane tilted to the first plane, a second plane opposed to the first plane and substantially parallel to the first plane, and a second tilted plane opposed to the first plane and tilted to the second plane, an angle formed between the first plane and the first tilted plane and an angle formed between the second plane and the second tilted plane being obtuse angles; a first semiconductor laser element including a first base and a first light emitting part; and a second semiconductor laser element including a second base and a second light emitting part, wherein the light guide is located between the first light emitting part and the second light emitting part, the first light emitting part is opposed to the first tilted plane, and the second light emitting part is opposed to the second tilted plane.

According to the other embodiment, an illumination device includes: a light guide having a first plane, a second plane opposed to the first plane and substantially parallel to the first plane, a side plane, and first and second recess parts depressed in the side plane; a first semiconductor laser element including a first base and a first light emitting part; a second semiconductor laser element including a second base and a second light emitting part; and a third semiconductor laser element including a third base and a third light emitting part, wherein the first light emitting part, the second light emitting part, and the third light emitting part are configured to emit light having wavelengths different from each other, the first semiconductor laser element is disposed in the first recess part, the third semiconductor laser element is disposed in the second recess part, and the second semiconductor laser element is located between the first semiconductor laser element and the third semiconductor laser element and opposed to the side plane.

According to the embodiments, an illumination device capable of improving uniformity in color chromaticity in a plane and being downsized can be provided.

Embodiments will be described hereinafter with reference to the accompanying drawings.

The disclosure is a mere example, and arbitrary change of gist which can be easily conceived by a person of ordinary skill in the art naturally falls within the inventive scope. To more clarify the explanations, the drawings may pictorially show width, thickness, shape and the like of each portion as compared with actual embodiments, but they are mere examples and do not restrict the interpretation of the invention. Furthermore, in the description and figures of the present application, structural elements having the same or similar functions will be referred to by the same reference numbers and detailed explanations of them that are considered redundant may be omitted.

In the figures, an X-axis, a Y-axis and a Z-axis orthogonal to each other are described in the drawings to facilitate understanding as needed. A direction along the X-axis is referred to as an X-direction or a first direction, a direction along the Y-axis is referred to as a Y-direction or a second direction, and a direction along the Z-axis is referred to as a Z-direction or a third direction. A plane defined by the X-axis and the Y-axis is referred to as an X-Y plane, a plane defined by the X-axis and Z-axis is referred to as a X-Z plane, and a plane defined by the Y-axis and Z-axis is referred to as a Y-Z plane. Viewing the X-Y plane is referred to as planar view. The first direction X and the second direction Y correspond to directions parallel to the main surface of the light guide included in the illumination device, and the third direction Z corresponds to the thickness direction of the light guide.

Figure 1:
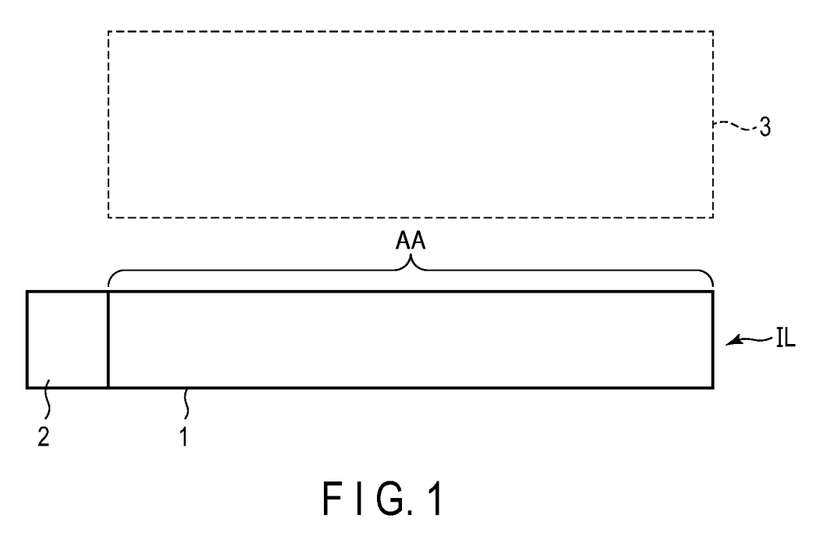
FIG. 1 is a view illustrating an illumination device IL of embodiments.

FIG. 1 is a view illustrating an example of an illumination device IL according to the embodiments.

The illumination device IL comprises a light guide 1 and a light emitting device 2. The light guide 1 and the light emitting device 2 shown in FIG. 1 do not reflect their shapes, and details of the light guide 1 and the light emitting device 2 will be described later. The light emitting device 2 is disposed on one end side of the light guide 1. An effective area AA of the light guide 1 is an area where light propagating inside the light guide 1 is emitted, and overlaps an illumination target 3. The illumination target 3 represented by a dotted line in the figure is, for example, a liquid crystal panel.

When the liquid crystal panel is a transmissive panel that displays images by selectively transmitting illumination light, the illumination device IL functions as a backlight device. In addition, when the liquid crystal panel is a reflective panel that displays images by selectively reflecting illumination light, the illumination device IL functions as a front light device.

The illumination target 3 is not limited to the liquid crystal panel, but may also be a display panel comprising an electrophoretic element, a display panel to which microelectromechanical systems (MEMS) are applied, or the like.

A display device can be configured by combining the illumination device IL of the embodiments with the display panel which is the illumination target 3.

Configuration Example 1

Figure 2:
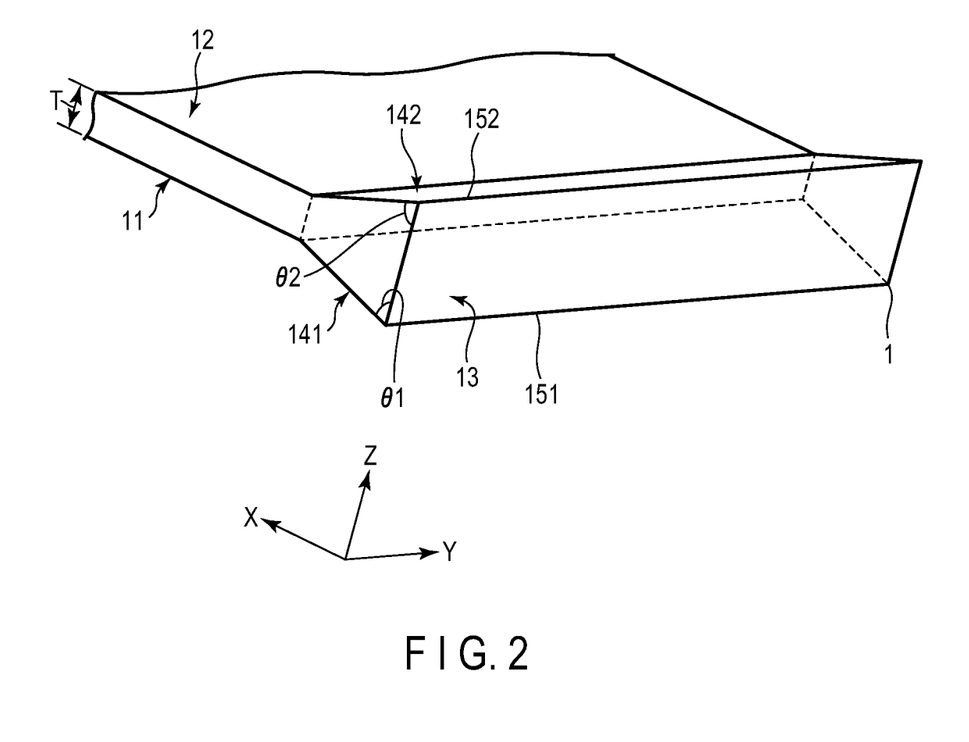
FIG. 2 is a view showing an example of the light guide 1 shown in FIG. 1.

FIG. 2 is a view showing an example of the light guide 1 shown in FIG. 1.

The light guide 1 has a first plane 11, a second plane 12, a side plane 13, a first tilted plane 141, and a second tilted plane 142. The first plane 11 is a plane parallel to the X-Y plane. The second plane 12 is opposed to the first plane 11 in the third direction Z. The second plane 12 is a plane substantially parallel to the first plane 11 or the X-Y plane. The side plane 13 is a plane perpendicular to the first plane 11 and the second plane 12 and substantially parallel to the Y-Z plane.

The first tilted plane 141 and the second tilted plane 142 extend in the second direction Y and are opposed to each other in the third direction Z. In addition, the first tilted plane 141 and the second tilted plane 142 are non-parallel to each other.

The first tilted plane 141 is located between the side plane 13 and the first plane 11 in the first direction X to connect the side plane 13 and the first plane 11. The first tilted plane 141 is a plane titled to the first plane 11 or the X-Y plane. The second tilted plane 142 is located between the side plane 13 and the second plane 12 in the first direction X to connect the side plane 13 and the second plane 12. The second tilted plane 142 is a plane titled to the second plane 12 or the X-Y plane.

An angle θ1 formed between the side plane 13 and the first tilted plane 141, and an angle θ2 formed between the side plane 13 and the second tilted plane 142 are acute angles. For example, the angle θ1 is equal to the angle θ2, but may be different from the angle θ2.

A first intersection part 151 of the side plane 13 and the first tilted plane 141, and a second intersection part 152 of the side plane 13 and the second tilted plane 142 extend in the second direction Y and form ridges, but may be rounded or chamfered.

A thickness T of the light guide 1 along the third direction Z in the area where the first plane 11 and the second plane 12 are opposed to each other is, for example, 1.0 mm to 1.5 mm. The thickness is increased toward the side plane 13 in the first direction X, in the area where the first tilted plane 141 and the second tilted plane 142 are opposed to each other.

The light guide 1 may be formed of glass or resin.

Figure 3:
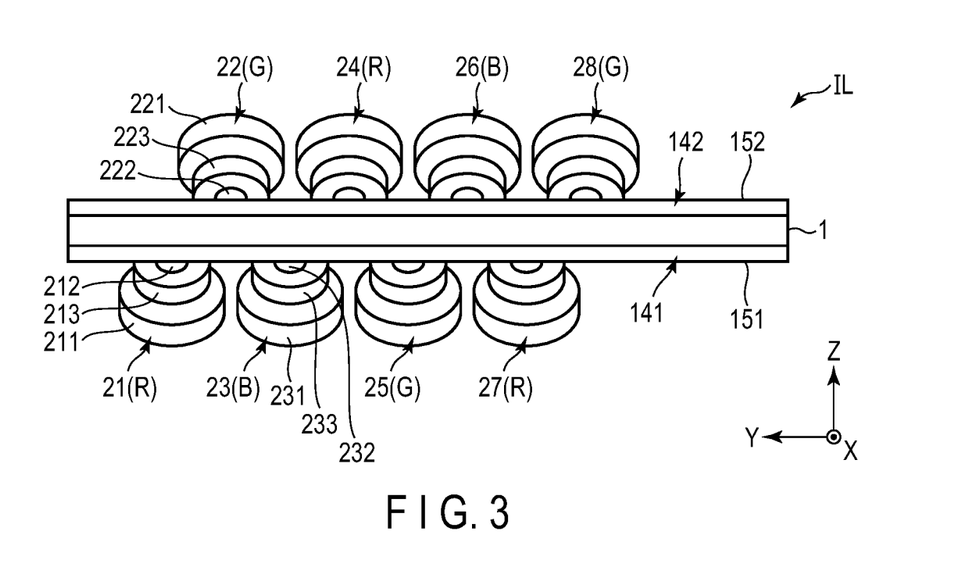
FIG. 3 is a side view showing an example of the illumination device IL comprising the light guide 1 shown in FIG. 2.

FIG. 3 is a side view showing an example of the illumination device IL comprising the light guide 1 shown in FIG. 2. A side view of the illumination device IL on the Y-Z plane is illustrated.

The illumination device IL comprises a plurality of semiconductor laser elements including the first semiconductor laser element 21, the second semiconductor laser element 22, and the third semiconductor laser element 23 as the light emitting devices 2.

The first semiconductor laser element 21 includes a first base 211, a first light emitting part 212, and a first cap 213. The first cap 213 surrounds the first light emitting part 212. The first light emitting part 212 includes a semiconductor laser chip mounted on the first base 211 and a window portion through which light emitted from the semiconductor laser chip is transmitted, which are not illustrated in detail.

Similarly, the second semiconductor laser element 22 includes a second base 221, a second light emitting part 222, and a second cap 223. The second cap 223 surrounds the second light emitting part 222.

The third semiconductor laser element 23 includes a third base 231, a third light emitting part 232, and a third cap 233. The third cap 233 surrounds the third light emitting part 232.

The first light emitting part 212, the second light emitting part 222, and the third light emitting part 232 are configured to emit light having wavelengths different from each other. For example, the first light emitting part 212 is configured to emit red light (R), the second light emitting part 222 is configured to emit green light (G), and the third light emitting part 232 is configured to emit blue light (B).

Semiconductor laser elements 24 and 27 are configured to emit red light similarly to the first semiconductor laser element 21. Semiconductor laser elements 25 and 28 are configured to emit green light similarly to the second semiconductor laser element 22. A semiconductor laser element 26 is configured to emit blue light similarly to the third semiconductor laser element 23.

The first semiconductor laser element 21, the third semiconductor laser element 23, and the semiconductor laser elements 25 and 27 are arranged along the second direction Y at equal pitches. The second semiconductor laser element 22, and the semiconductor laser elements 24, 26, and 28 are arranged along the second direction Y at equal pitches, and are located on a side opposite to the first semiconductor laser element 21 with the light guide 1 sandwiched therebetween.

The first base 211 and the second base 221 are non-parallel to each other. The first base 211 and the third base 231 are adjacent to each other in the second direction Y and substantially parallel to each other.

The first light emitting part 212 and the third light emitting part 232 are opposed to the first intersection part 151. The second light emitting part 222 is opposed to the second intersection part 152. With respect to the position along the second direction Y, the second light emitting part 222 is located at a substantially middle position between the first light emitting part 212 and the third light emitting part 232.

Figure 4:
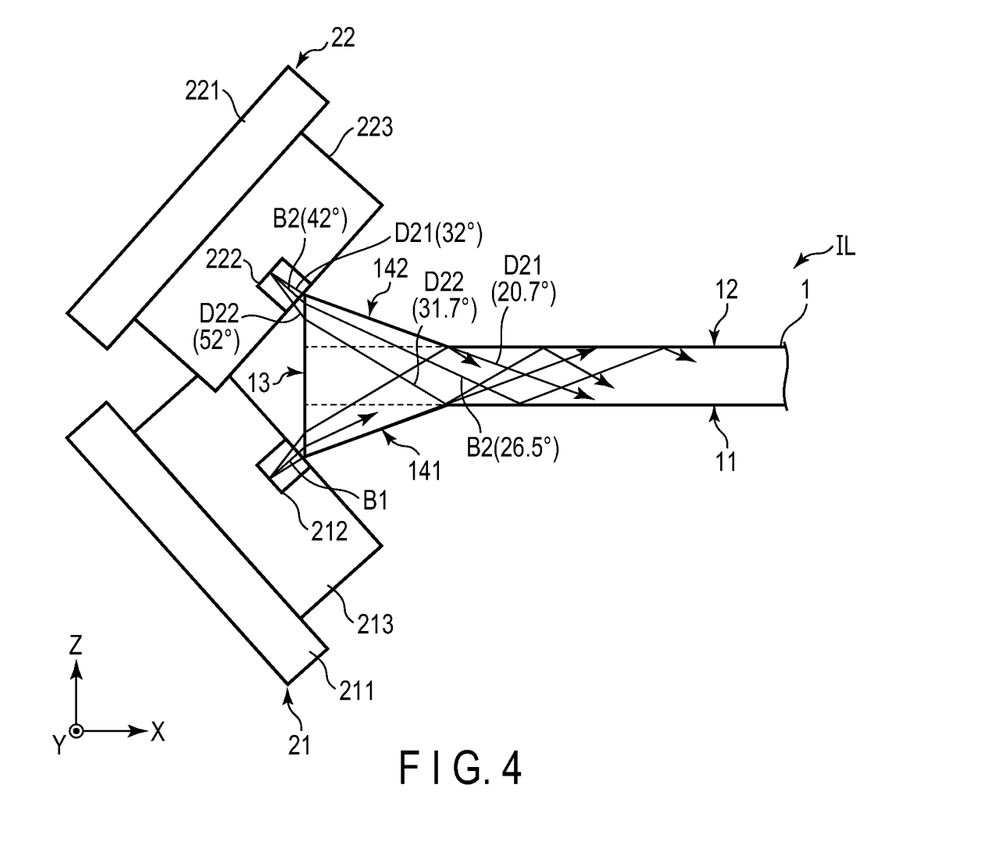
FIG. 4 is a cross-sectional view illustrating a shape example of the illumination device IL shown in FIG. 3.

FIG. 4 is a cross-sectional view illustrating a shape example of the illumination device IL shown in FIG. 3. A cross-sectional view of the illumination device IL on the X-Z plane is illustrated.

Each of a main light beam B1 of the emitted light from the first light emitting part 212 and a main light beam B2 of the emitted light from the second light emitting part 222 is tilted to the X-Y plane.

The tilt of the main light beam B2 to the X-Y plane or the tilt of the second semiconductor laser element 22 to the X-Y plane is set to satisfy the condition that the main light beam B2 is totally reflected on the first plane 11 immediately after made incident from the side plane 13, i.e., the condition that the incident angle to the first plane 11 is larger than or equal to the critical angle. Furthermore, it is assumed that the emitted light from the second light emitting part 222 includes divergent components D21 and D22 that are slightly divergent from the main light beam in addition to the main light beam. In this case, the tilt of the main light beam B2 is set to satisfy the condition that not only the main light beam B2 but also the divergent components D21 and D22 are totally reflected on the first plane 11 immediately after made incident from the side plane 13. In other words, most of the emitted light from the second light emitting part 222 does not reach the first tilted plane 141, but is totally reflected on the first plane 11.

For example, the main light beam B2 is tilted at an angle of 42 degrees clockwise to the X-Y plane.

The tilt of the second tilted plane 142 to the X-Y plane is set such that the divergent component D21 reaches the first plane 11 without leaking out of the light guide 1. When it is assumed that the tilt of the divergent component D21 before made incident on the light guide 1 is 32 degrees and the tilt of the divergent component D21 propagating through the light guide 1 is 20.7 degrees, the tilt of the second tilted plane 142 is set to be larger than or equal to 20.7 degrees clockwise to the X-Y plane.

The first semiconductor laser element 21 is configured similarly to the above second semiconductor laser element 22 and, for example, the main light beam B1 is tilted at an angle of 42 degrees counterclockwise to the X-Y plane. In addition, the tilt of the first tilted plane 141 is set to be larger than or equal to 20.7 degrees counterclockwise to the X-Y plane.

In the illumination device IL, each of the red light emitted from the first light emitting part 212 and the green light emitted from the second light emitting part 222 is made incident from the side plane 13. Most of the red light does not reach the second tilted plane 142, but is totally reflected on the second plane 12, and propagates inside the light guide 1. Most of the blue light does not reach the first tilted plane 141, but is totally reflected on the first plane 11, and propagates inside the light guide 1. The blue light emitted from the third light emitting part 232, which is not illustrated in the figure, is also totally reflected on the second plane 12 and propagates inside the light guide 1, similarly to the red light.

Figure 5:
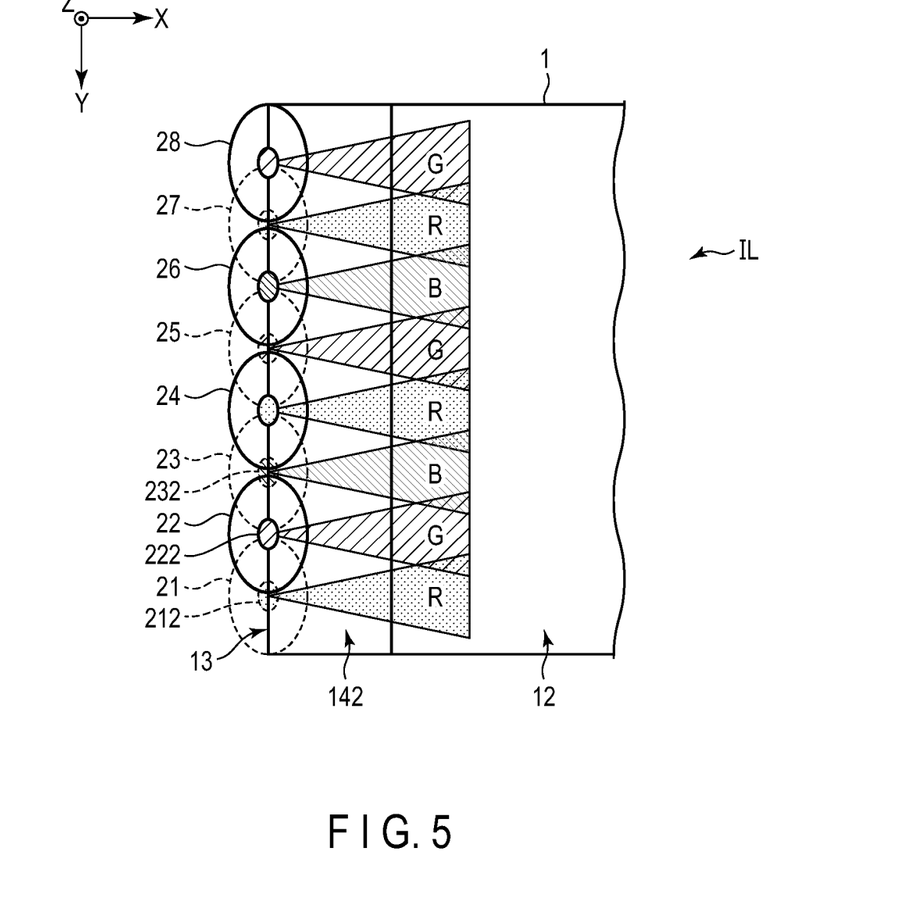
FIG. 5 is a plan view showing an example of the illumination device IL shown in FIG. 3.

FIG. 5 is a plan view showing an example of the illumination device IL shown in FIG. 3. The semiconductor laser elements located below the light guide 1 are represented by dotted lines, and the semiconductor laser elements located above the light guide 1 are represented by solid lines.

In planar view, the red light emitted from each of the first semiconductor laser element 21 and the semiconductor laser elements 24 and 27, the green light emitted from each of the second semiconductor laser element 22 and the semiconductor laser elements 25 and 28, and the blue light emitted from each of the third semiconductor laser element 23 and the semiconductor laser element 26, spread in the second direction Y while propagating along the first direction X and mix with each other.

According to the illumination device IL, the semiconductor laser elements are arranged in high density, and the distance along the first direction X required for the light of different wavelengths to mix with each other can be shortened as compared to the edge-light system in which a plurality of semiconductor laser elements aligned in a row along the second direction Y are opposed to the side planes of the light guide 1.

In addition, according to the above illumination device IL, the thickness of the light guide 1 can be made smaller as compared with the edge light system in which a plurality of semiconductor laser elements aligned in the third direction Z are opposed to the side planes of the light guide 1.

Thus, the uniformity in color chromaticity in the plane can be improved and downsizing the illumination device IL can be implemented.

Configuration Example 2

Figure 6:
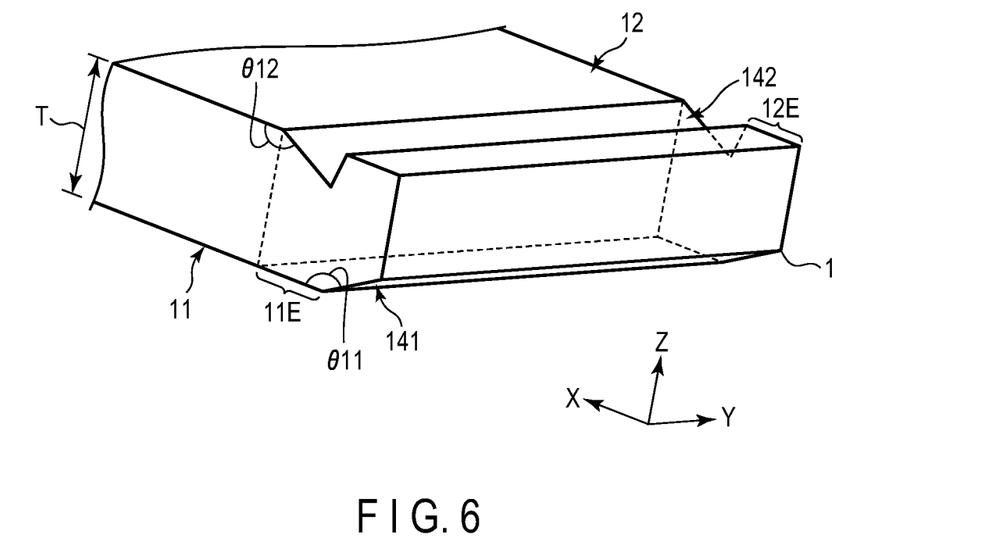
FIG. 6 is a view showing another example of the light guide 1 shown in FIG. 1.

FIG. 6 is a view showing another example of the light guide 1 shown in FIG. 1.

The light guide 1 has the first plane 11, the second plane 12, the first tilted plane 141, and the second tilted plane 142. The first plane 11 is a plane parallel to the X-Y plane. The first tilted plane 141 and the first plane 11 are arranged in the first direction X. The first tilted plane 141 is connected to the first plane 11 and tilted to the first plane 11. The second plane 12 is a plane substantially parallel to the first plane 11 or the X-Y plane. The second tilted plane 142 and the second plane 12 are arranged in the first direction X and opposed to the first plane 11 in the third direction Z. The second tilted plane 142 is connected to the second plane 12 and tilted to the second plane 12.

The first tilted plane 141 and the second tilted plane 142 extend in the second direction Y, are formed to be displaced in the first direction X, and are non-parallel to each other.

An angle θ11 formed between the first plane 11 and the first tilted plane 141, and an angle θ12 formed between the second plane 12 and the second tilted plane 142 are obtuse angles smaller than 180 degrees. For example, the angle θ11 is equal to the angle θ12, but the angle θ11 may be different from the angle θ12.

The area of the first plane 11 located directly below the second tilted plane 142 corresponds to the incident light area 11E. The area of the second plane 12 located directly above the first tilted plane 141 corresponds to the incident light area 12E.

A thickness T of the light guide 1 along the third direction Z in the area where the first plane 11 and the second plane 12 are opposed to each other is, for example, 1.0 mm to 1.5 mm.

The light guide 1 may be formed of glass or resin.

Figure 7:
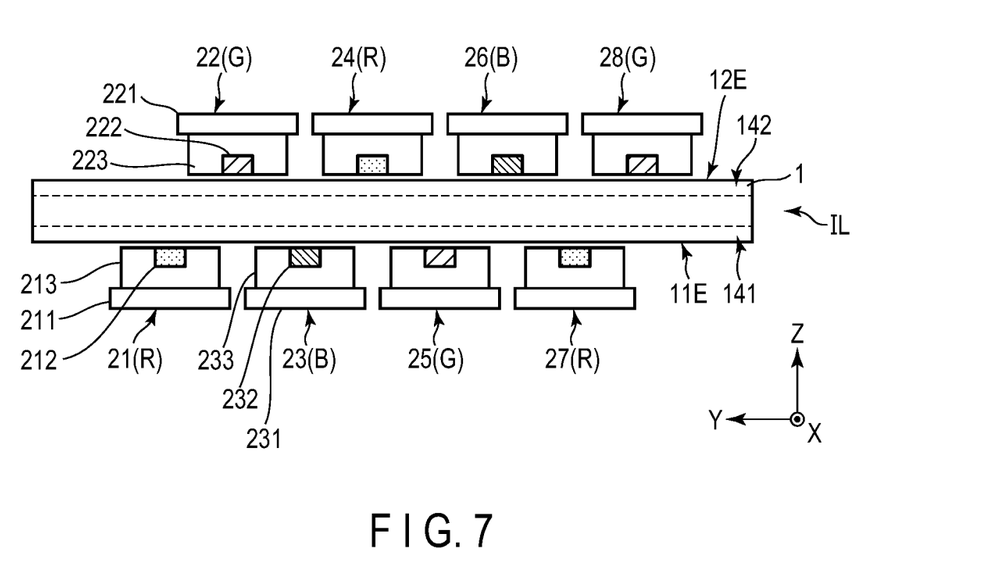
FIG. 7 is a side view showing an example of the illumination device IL comprising the light guide 1 shown in FIG. 6.

FIG. 7 is a side view showing an example of the illumination device IL comprising the light guide 1 shown in FIG. 6. A side view of the illumination device IL on the Y-Z plane is illustrated.

The illumination device IL comprises a plurality of semiconductor laser elements including the first semiconductor laser element 21, the second semiconductor laser element 22, and the third semiconductor laser element 23 as the light emitting devices 2.

The first semiconductor laser element 21 and the semiconductor laser elements 24 and 27 are configured to emit red light. The second semiconductor laser element 22, and the semiconductor laser elements 25 and 28 are configured to emit green light. The third semiconductor laser element 23 and the semiconductor laser element 26 are configured to emit blue light.

The first semiconductor laser element 21, the third semiconductor laser element 23, and the semiconductor laser elements 25 and 27 are arranged along the second direction Y at equal pitches. The second semiconductor laser element 22, and the semiconductor laser elements 24, 26, and 28 are arranged along the second direction Y at equal pitches, and are located on a side opposite to the first semiconductor laser element 21 with the light guide 1 sandwiched therebetween. With respect to the position along the second direction Y, the second light emitting part 222 is located at a substantially middle position between the first light emitting part 212 and the third light emitting part 232.

The first base 211 and the second base 221 are substantially parallel to each other. In addition, the first base 211 and the third base 231 are also substantially parallel to each other.

Figure 8:
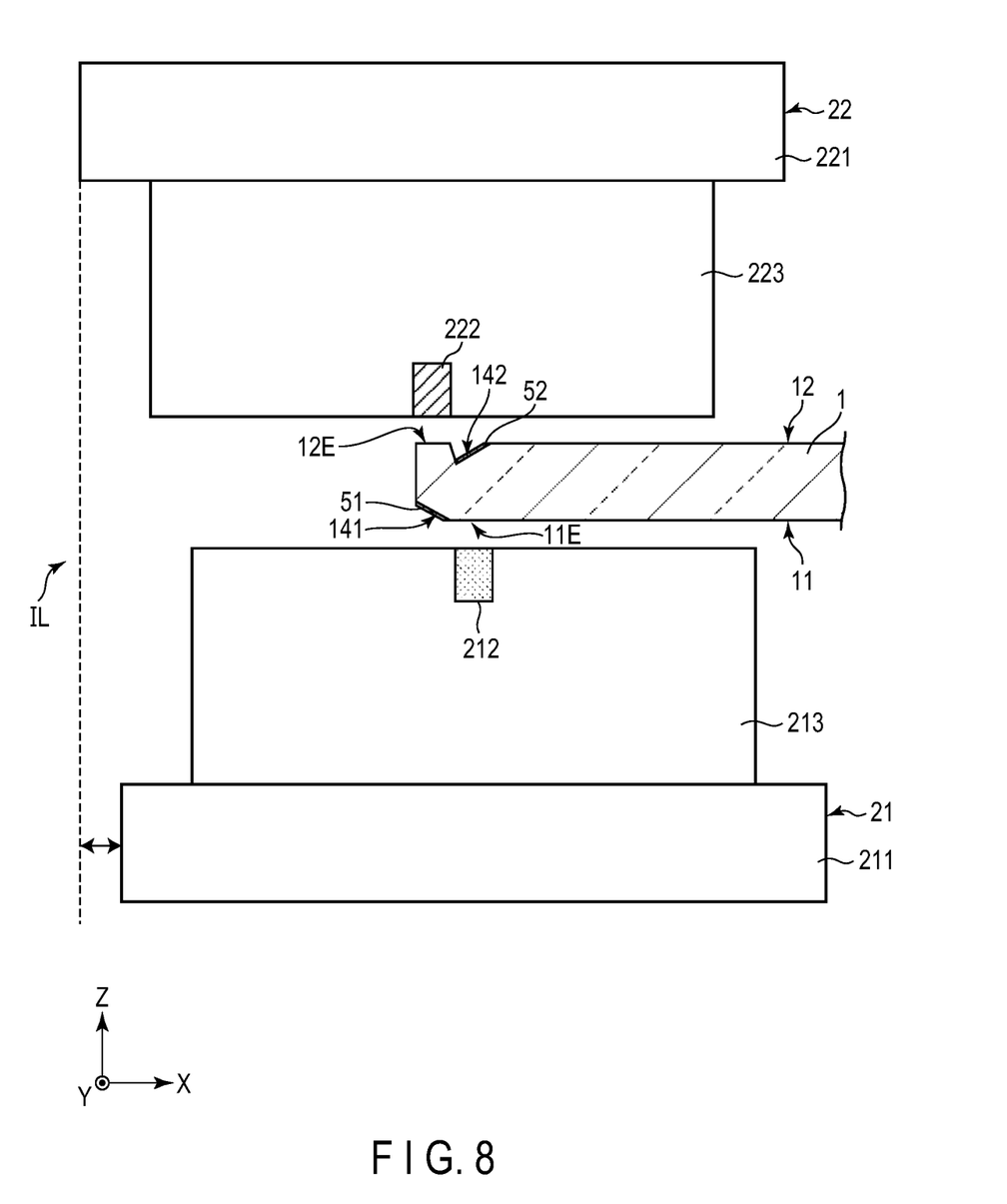
FIG. 8 is a cross-sectional view showing an example of the illumination device IL shown in FIG. 7.

FIG. 8 is a cross-sectional view showing an example of the illumination device IL shown in FIG. 7. A cross-sectional view of the illumination device IL on the X-Z plane is illustrated.

The illumination device IL further comprises a first reflective layer 51 and a second reflective layer 52. The first reflective layer 51 is disposed to cover substantially the entire surface of the first tilted plane 141. The second reflective layer 52 is disposed to cover substantially the entire surface of the second tilted plane 142.

The first semiconductor laser element 21 and the second semiconductor laser element 22 are displaced in the first direction X. One end part of the light guide 1 including the first tilted plane 141 and the second tilted plane 142 is located between the first semiconductor laser element 21 and the second semiconductor laser element 22 in the third direction Z. The first semiconductor laser element 21 emits light upward where the light guide 1 is located, and the second semiconductor laser element 22 emits light downward where the light guide 1 is located. This matter will be described below more specifically.

For the first semiconductor laser element 21, the first light emitting part 212 is opposed to the incident light area 11E and the second tilted plane 142 in the third direction Z. The incident light area 11E is located between the first light emitting part 212 and the second tilted plane 142. The first light emitting part 212 is configured to emit light toward the incident light area 11E.

For the second semiconductor laser element 22, the second light emitting part 222 is opposed to the incident light area 12E and the first tilted plane 141 in the third direction Z. The incident light area 12E is located between the second light emitting part 222 and the first tilted plane 141. The second light emitting part 222 is configured to emit light toward the incident light area 12E.

Referring again to FIG. 7, for the third semiconductor laser element 23, the third base 231 is adjacent to the first base 211 in the second direction Y, and the third light emitting part 232 is opposed to the incident light area 11E and the second tilted plane 142 in the third direction Z. The third light emitting part 232 is configured to emit light toward the incident light area 11E.

In short, each of the first semiconductor laser element 21, the third semiconductor laser element 23, and the semiconductor laser elements 25 and 27 is opposed to the second tilted plane 142 and emits light toward the incident light area 11E. In addition, each of the second semiconductor laser element 22, and the semiconductor laser elements 24, 26, and 28 is opposed to the first tilted plane 141 and emits the light toward the incident light area 12E.

Figure 9:
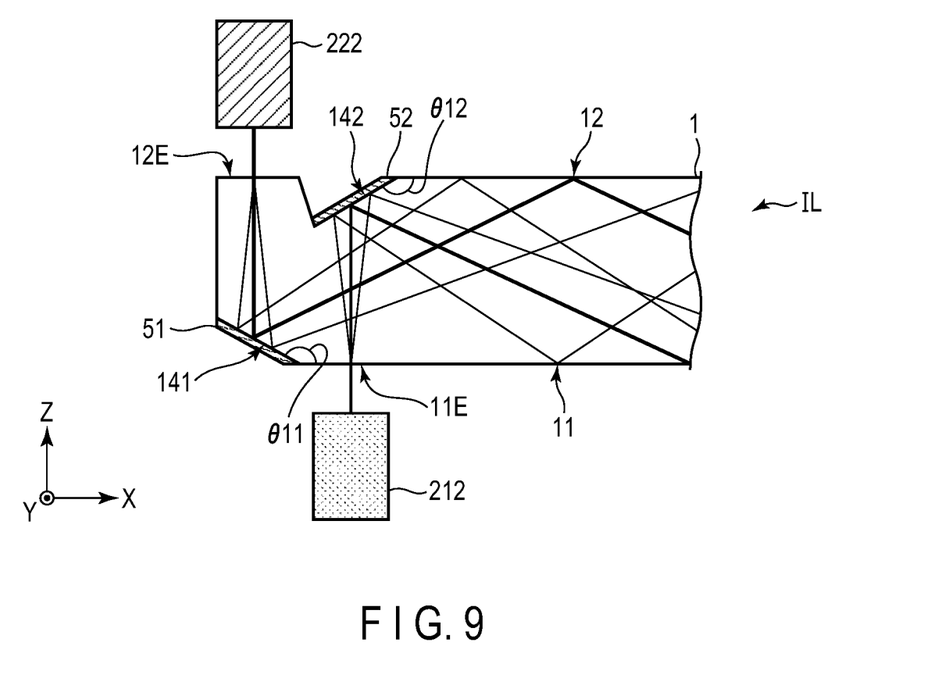
FIG. 9 is an expanded cross-sectional view showing a part of the illumination device IL shown in FIG. 8.

FIG. 9 is an expanded cross-sectional view showing a part of the illumination device IL shown in FIG. 8. The only constituent elements necessary for descriptions are illustrated in FIG. 9.

The red light emitted from the first light emitting part 212 is made incident from the incident light area 11E and reflected on the second reflective layer 52 or the interface between the second tilted plane 142 and the second reflective layer 52. The reflected red light is totally reflected on the first plane 11 to propagate inside the light guide 1.

The green light emitted from the second light emitting part 222 is made incident from the incident light area 12E and reflected on the first reflective layer 51 or the interface between the first tilted plane 141 and the first reflective layer 51. The reflected green light is totally reflected on the second plane 12 to propagate inside the light guide 1.

The blue light emitted from the third light emitting part 232, which is omitted in the figure, is also made incident from the incident light area 11E, reflected on the second reflective layer 52, and totally reflected on the first plane 11 to propagate inside the light guide 1, similarly to the red light.

The angle θ11 formed between the first plane 11 and the first tilted plane 141 is set to satisfy the condition that the reflected light on the first tilted plane 141 is totally reflected on the second plane 12, i.e., the condition that the incident angle to the second plane 12 is larger than or equal to a critical angle. Similarly, the angle θ12 formed between the second plane 12 and the second tilted plane 142 is set to satisfy the condition that the reflected light on the second tilted plane 142 is totally reflected on the first plane 11, i.e., the condition that the incident angle to the first plane 11 is larger than or equal to a critical angle. For example, the angle θ11 is in a range of 145 to 150 degrees, and the angle θ12 is in a range of 145 to 150 degrees.

Figure 10:
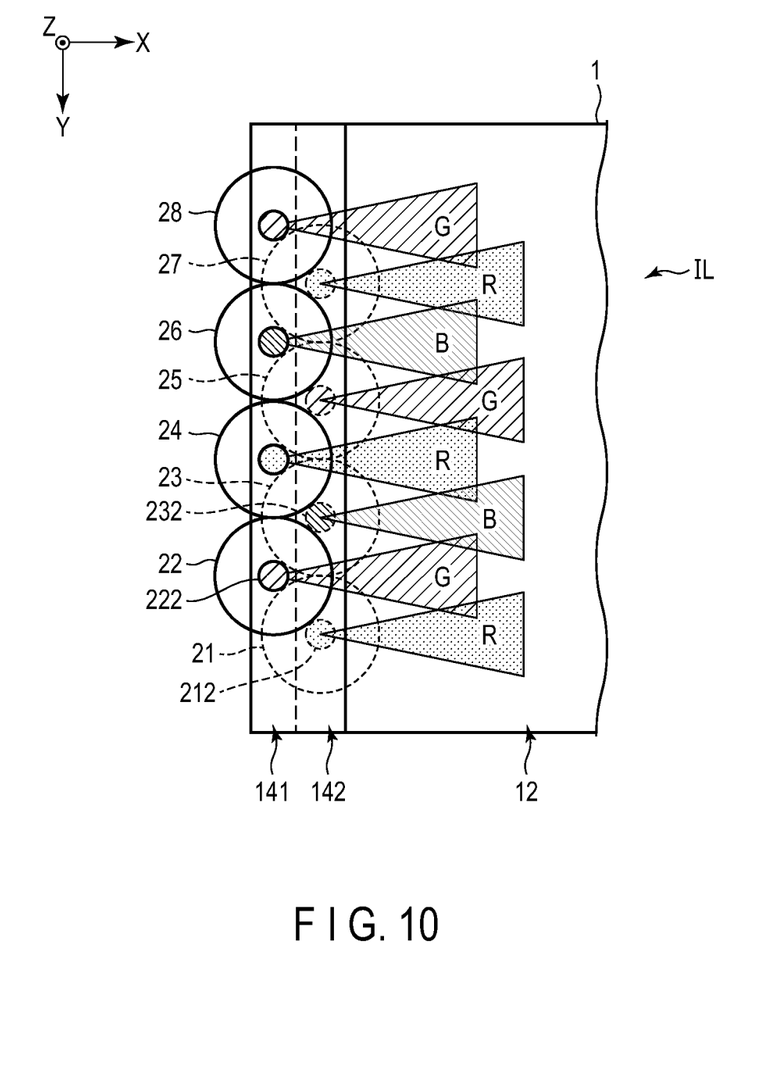
FIG. 10 is a plan view showing an example of the illumination device IL shown in FIG. 7.

FIG. 10 is a plan view showing an example of the illumination device IL shown in FIG. 7. The semiconductor laser elements located below the light guide 1 are represented by dotted lines, and the semiconductor laser elements located above the light guide 1 are represented by solid lines.

In planar view, the red light emitted from each of the first semiconductor laser element 21 and the semiconductor laser elements 24 and 27, the green light emitted from each of the second semiconductor laser element 22 and the semiconductor laser elements 25 and 28, and the blue light emitted from each of the third semiconductor laser element 23 and the semiconductor laser element 26, spread in the second direction Y while propagating along the first direction X and mix with each other.

In the illumination device IL, too, the semiconductor laser elements are arranged in high density and can reduce the distance along the first direction X required for the light having wavelengths different from each other to mix with each other, similarly to the above examples.

In addition, each of the semiconductor laser elements is disposed such that at least the light emitting parts overlap the light guide 1 in planar view. For this reason, the length of the illumination device IL along the first direction X can be reduced as compared with the edge light system in which a plurality of semiconductor laser elements are opposed to the side surfaces of the light guide 1.

Configuration Example 3

Figure 11:
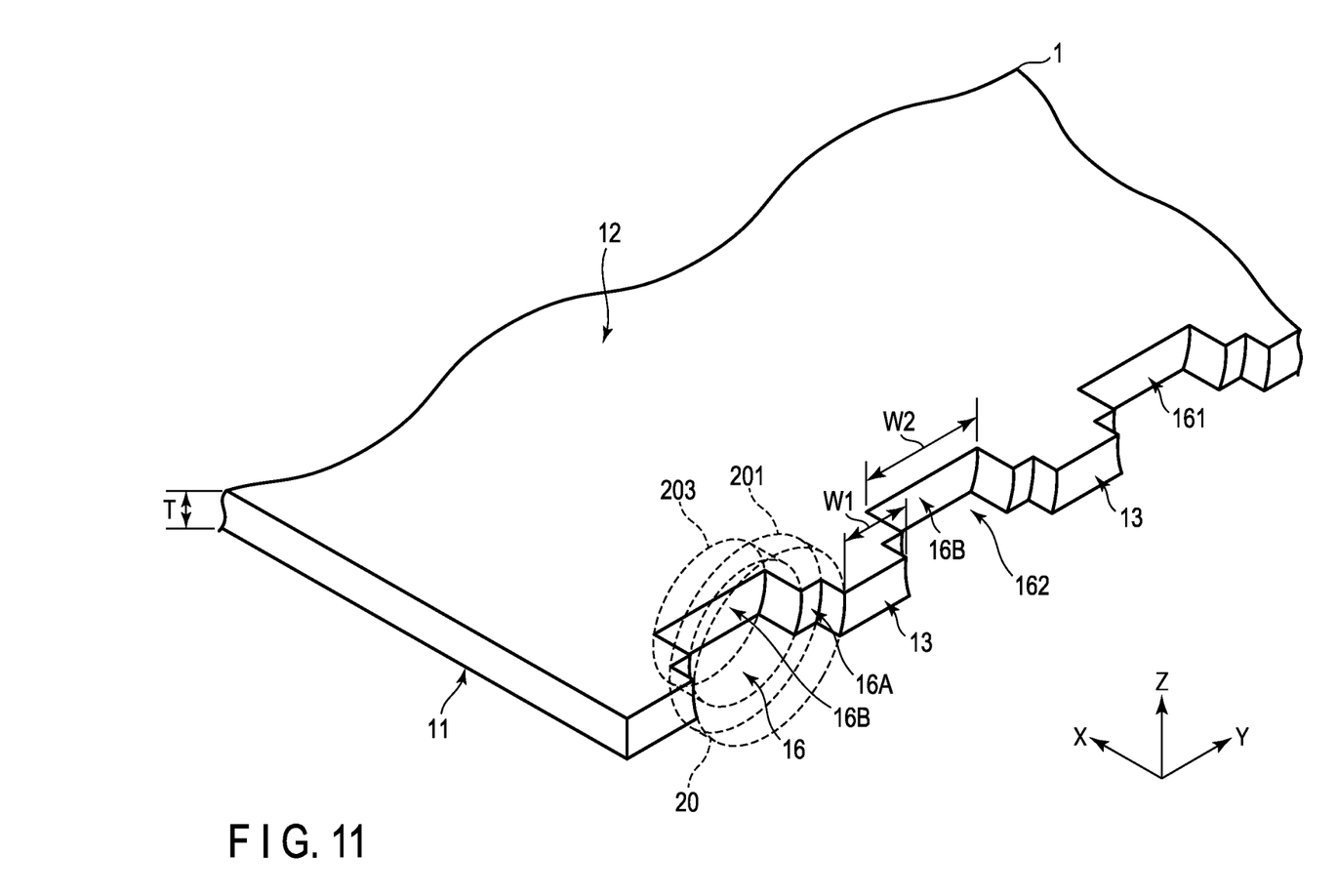
FIG. 11 is a view showing the other example of the light guide 1 shown in FIG. 1.

FIG. 11 is a view showing the other example of the light guide 1 shown in FIG. 1.

The light guide 1 has the first plane 11, the second plane 12, the side plane 13, a first recess part 161, and a second recess part 162. The first plane 11 is a plane parallel to the X-Y plane. The second plane 12 is a plane substantially parallel to the first plane 11 or the X-Y plane. The second plane 12 is opposed to the first plane 11 in the third direction Z.

The first recess part 161 and the second recess part 162 correspond to areas depressed in the side plane 13 in the light guide 1. A plurality of recess parts including the first recess part 161 and the second recess part 162 are formed at equal pitches along the second direction Y. The side plane 13 is a surface approximately parallel to the Y-Z plane and is located between adjacent recess portions 16.

Each of the recess portions 16 includes a first part 16A depressed in accordance with the shape of the base 201 and a second part 16B depressed in accordance with the shape of the cap 203, of the semiconductor laser element 20, as represented by dotted lines. The depth of the first part 16A along the first direction X is equal to the thickness of the base 201, and the depth of the second part 16B along the first direction X is equal to the thickness of the cap 203.

An interval between the adjacent recess portions 16, i.e., a width W1 of the side plane 13 along the second direction Y is smaller than a width W2 of the second part 16B in the recess portion 16 along the second direction Y.

A thickness T of the light guide 1 along the third direction Z in the area where the first plane 11 and the second plane 12 are opposed to each other is, for example, 1.0 mm to 1.5 mm.

The light guide 1 may be formed of glass or resin.

Figure 12:
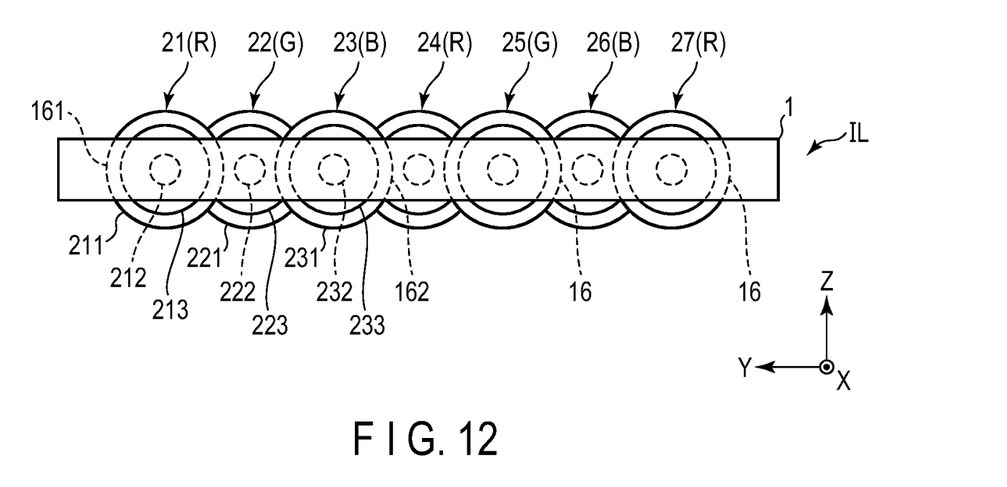
FIG. 12 is a side view showing an example of the illumination device IL comprising the light guide 1 shown in FIG. 11.

FIG. 12 is a side view showing an example of the illumination device IL comprising the light guide 1 shown in FIG. 11. A side view of the illumination device IL on the Y-Z plane is illustrated.

The illumination device IL comprises a plurality of semiconductor laser elements including the first semiconductor laser element 21, the second semiconductor laser element 22, and the third semiconductor laser element 23 as the light emitting devices 2.

The first semiconductor laser element 21 and the semiconductor laser elements 24 and 27 are configured to emit red light. The second semiconductor laser element 22 and the semiconductor laser element 25 are configured to emit green light. The third semiconductor laser element 23 and the semiconductor laser element 26 are configured to emit blue light.

The first semiconductor laser element 21, the second semiconductor laser element 22, the third semiconductor laser element 23, and the semiconductor laser elements 24 to 28 are arranged at equal pitches along the second direction Y. With respect to the position along the second direction Y, the second light emitting part 222 is located at a substantially middle position between the first light emitting part 212 and the third light emitting part 232. The first base 211, the second base 221, and the third base 231 are substantially parallel to each other.

The first semiconductor laser element 21 is disposed in the first recess part 161, and the third semiconductor laser element 23 is disposed in the second recess part 162. Similarly, the other semiconductor laser elements 25 and 27 are disposed in the recess portions 16, respectively. In each of the semiconductor laser elements disposed in the recess portions 16, the light emitting part is opposed to the second part 16B.

The second semiconductor laser element 22 is located between the first semiconductor laser element 21 and the third semiconductor laser element 23 and is opposed to the side plane 13. Similarly, each of the other semiconductor laser elements 24 and 26 is opposed to the side plane 13. For each of these semiconductor laser elements, the light emitting parts are opposed to the side plane 13.

The second cap 223 of the second semiconductor laser element 22 overlaps the first base 211 of the first semiconductor laser element 21 and the third base 231 of the third semiconductor laser element 23. The second light emitting part 222 is located between the first base 211 and the third base 231.

Figure 13:
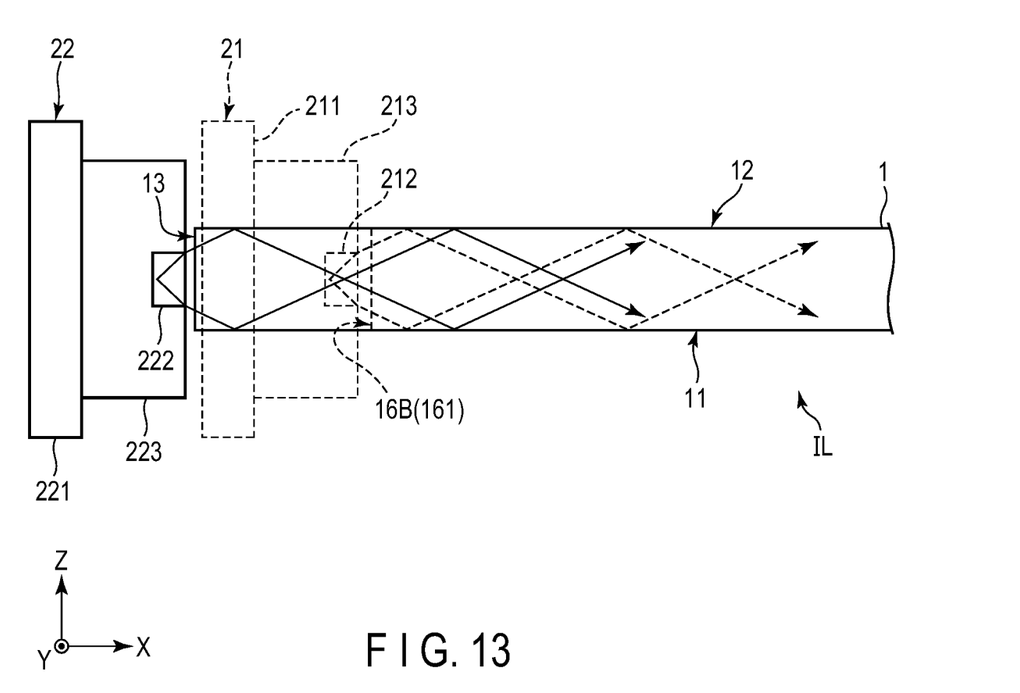
FIG. 13 is an enlarged cross-sectional view showing a part of the illumination device IL shown in FIG. 12.

FIG. 13 is an enlarged cross-sectional view showing a part of the illumination device IL shown in FIG. 12.

In the first semiconductor laser element 21 represented by a dotted line, the first light emitting part 212 is opposed to the second part 16B of the first recess part 161. The red light emitted from the first light emitting part 212 is made incident from the second part 16B and totally reflected on the first plane 11 and the second plane 12 to propagate inside the light guide 1.

In the second semiconductor laser element 22 represented by a solid line, the second light emitting part 222 is opposed to the side plane 13. The green light emitted from the second light emitting part 222 is made incident from the side plane 13 and totally reflected on the first plane 11 and the second plane 12 to propagate inside the light guide 1.

The blue light emitted from the third light emitting part 232, which is not illustrated in the figure, is also made incident from the second part 16B and totally reflected on the first plane 11 and the second plane 12 to propagate inside the light guide 1, similarly to the red light.

Figure 14:
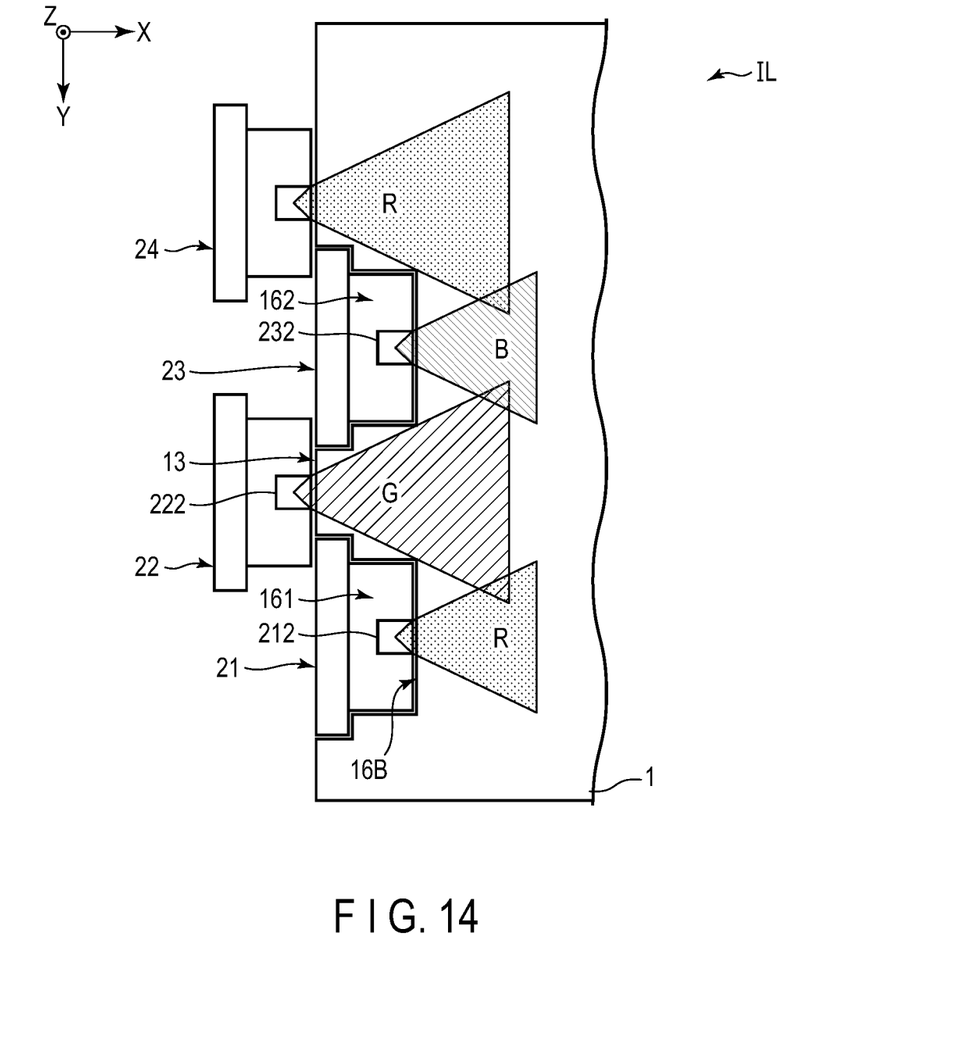
FIG. 14 is a plan view showing an example of the illumination device IL shown in FIG. 12.

FIG. 14 is a plan view showing an example of the illumination device IL shown in FIG. 12.

In planar view, the red light emitted from each of the first semiconductor laser element 21 and the semiconductor laser element 24, the green light emitted from each of the second semiconductor laser element 22 and the like, and the blue light emitted from each of the third semiconductor laser element and the like spread in the second direction Y while propagating along the first direction X and mix with each other.

In the illumination device IL, too, the semiconductor laser elements are arranged in high density and can reduce the distance along the first direction X required for the light having wavelengths different from each other to mix with each other, similarly to the above examples.

According to the above-described embodiments, an illumination device capable of improving the uniformity in color chromaticity in the plane and being downsized can be provided.

All of the illumination devices that can be implemented by a person of ordinary skill in the art through arbitrary design changes to the illumination devices described above as embodiments of the present invention come within the scope of the present invention as long as they are in keeping with the spirit of the present invention.

Various types of the modified examples are easily conceivable within the category of the ideas of the present invention by a person of ordinary skill in the art and the modified examples are also considered to fall within the scope of the present invention. For example, additions, deletions or changes in design of the constituent elements or additions, omissions, or changes in condition of the processes arbitrarily conducted by a person of ordinary skill in the art, in the above embodiments, fall within the scope of the present invention as long as they are in keeping with the spirit of the present invention.

In addition, the other advantages of the aspects described in the embodiments, which are obvious from the descriptions of the present specification or which can be arbitrarily conceived by a person of ordinary skill in the art, are considered to be achievable by the present invention as a matter of course.

What is claimed is:

1. An illumination device comprising:
   a light guide including a first plane, a second plane opposed to the first plane and substantially parallel to the first plane, a side plane, a first tilted plane located between the side plane and the first plane and tilted to the first plane, and a second tilted plane located between the side plane and the second plane and tilted to the second plane, an angle formed between the side plane and the first tilted plane and an angle formed between the side plane and the second tilted plane being acute angles;
   a first semiconductor laser element including a first base and a first light emitting part; and
   a second semiconductor laser element including a second base and a second light emitting part,
   wherein
   the first base and the second base are non-parallel to each other,
   the first light emitting part is opposed to a first intersection part of the side plane and the first tilted plane,
   the second light emitting part is opposed to a second intersection part of the side plane and the second tilted plane,
   a thickness of the light guide in an area where the first tilted plane and the second tilted plane are opposed to each other, is increased toward the side plane, and
   a thickness of the light guide in an area where the first plane and the second plane are opposed to each other, is less than a thickness of the light guide in the side plane.

2. The illumination device of claim 1, further comprising:
   a third semiconductor laser element including a third base and a third light emitting part,
   wherein
   the third base is adjacent to the first base,
   the third light emitting part is opposed to the first intersection part, and
   the first light emitting part, the second light emitting part, and the third light emitting part are configured to emit light having wavelengths different from each other.

3. The illumination device of claim 1, wherein
   in planar view, the first light emitting part does not overlap the second light emitting part.

4. An illumination device comprising:
   a light guide including a first plane, a first tilted plane tilted to the first plane connected to the first plane and, a second plane opposed to the first plane and substantially parallel to the first plane, a second tilted plane opposed to the first plane, connected to the second plane and tilted to the second plane, and a side plane, an angle formed between the first plane and the first tilted plane and an angle formed between the second plane and the second tilted plane being obtuse angles; smaller than 180 degrees;
   a first reflective layer disposed on the first tilted plane;
   a second reflective layer disposed on the second tilted plane;
   a first semiconductor laser element including a first base and a first light emitting part; and
   a second semiconductor laser element including a second base and a second light emitting part,
   wherein
   the light guide is located between the first light emitting part and the second light emitting part,
   the first light emitting part is opposed to the first tilted plane,
   the second light emitting part is opposed to the second tilted plane, and
   a thickness of the light guide in an area where the first plane and the second tilted plane are opposed to each other, is decreased toward the side plane.

5. The illumination device of claim 4, further comprising:
   a third semiconductor laser element including a third base and a third light emitting part,
   wherein
   the third base is adjacent to the first base,
   the third light emitting part is opposed to the first tilted plane, and
   the first light emitting part, the second light emitting part, and the third light emitting part are configured to emit light having wavelengths different from each other.

6. The illumination device of claim 4, wherein
   in planar view, the first light emitting part does not overlap the second light emitting part.

7. An illumination device comprising:
   a light guide including a first plane, a second plane opposed to the first plane and substantially parallel to the first plane, a side plane, and first and second recess parts depressed in the side plane;
   a first semiconductor laser element including a first base, a first light emitting part, and a first cap surrounding the first light emitting part;
   a second semiconductor laser element including a second base and a second light emitting part; and
   a third semiconductor laser element including a third base and a third light emitting part,
   wherein
   the first light emitting part, the second light emitting part, and the third light emitting part are configured to emit light having wavelengths different from each other,
   the first semiconductor laser element is disposed in the first recess part, the third semiconductor laser element is disposed in the second recess part, and the second semiconductor laser element is located between the first semiconductor laser element and the third semiconductor laser element and opposed to the side plane, the first recess part includes a first part depressed in accordance with a shape of the first base, a second part depressed in accordance with a shape of the first cap, and a plane opposed to a tip of the first cap, and the plane is parallel to the side plane.

8. The illumination device of claim 7, wherein the second semiconductor laser element further includes a cap surrounding the second light emitting part, and the cap overlaps the first base and the third base.

9. The illumination device of claim 7, wherein a depth of the first part is equal to a thickness of the first base, and a depth of the second part is equal to a thickness of the first cap.

\* \* \* \* \*